(12) United States Patent
Hsiung et al.

(10) Patent No.: US 6,590,239 B2
(45) Date of Patent: Jul. 8, 2003

(54) COLOR FILTER IMAGE ARRAY OPTOELECTRONIC MICROELECTRONIC FABRICATION WITH A PLANARIZING LAYER FORMED UPON A CONCAVE SURFACED COLOR FILTER REGION

(75) Inventors: Chung-Sheng Hsiung, Kaohsiung (TW); Kuo-Liang Lu, Hsin-Chu (TW); Yu-Kung Hsiao, Tao-Yuan (TW); Chih-Kung Chang, Hsin-Chu (TW); Fu-Tien Wong, Taw-Yuan (TW); Sung-Yung Yang, Kaohsiung (TW); Chin-Chen Kuo, Taipei (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 09/918,043

(22) Filed: Jul. 30, 2001

(65) Prior Publication Data

US 2003/0020083 A1 Jan. 30, 2003

(51) Int. Cl.⁷ ................. H01L 27/148; H01L 29/76; H01L 29/765
(52) U.S. Cl. ................. 257/233; 257/214; 257/291; 257/294; 257/225; 257/229; 257/232; 438/70
(58) Field of Search .................. 438/22, 25, 26, 438/27, 28, 29, 46–48, 70; 257/88, 89, 90, 95, 98.233, 294, 213–215, 223, 5, 256–258, 290–291, 232; 341/150; 349/80, 104, 106

(56) References Cited

U.S. PATENT DOCUMENTS

| 4,651,001 A | * | 3/1987 | Harada et al. ............... 250/330 |
| 4,916,530 A | * | 4/1990 | Neilson et al. ............... 358/75 |
| 5,514,888 A | | 5/1996 | Sano et al. |
| 5,796,154 A | * | 8/1998 | Sano et al. .................. 257/432 |
| 6,171,885 B1 | * | 1/2001 | Fan et al. ...................... 438/70 |

OTHER PUBLICATIONS

Sano, Y., et al, "Submicron spaced lens array proces technology for a high photosensitivity CC sensor", in Prcoeedings of International Conf. "Electron Devices Meeting" (Technical Digest), pp. 283–286, San Francisco, CA, USA (Dec. 9–12, 1990).*

Mutoh, H., "Simulation for 3–D Optical and Electrical Analysis of CCD", IEEE Transactions on Electron Devices, vol. 44, No. 10, Oct. 1997.*

* cited by examiner

*Primary Examiner*—Nathan J. Flynn
*Assistant Examiner*—Johannes P Mondt
(74) *Attorney, Agent, or Firm*—Tung & Associates

(57) ABSTRACT

Within a method for forming a color filter image array optoelectronic microelectronic fabrication, and the color filter image array optoelectronic microelectronic fabrication formed employing the method, there is provided a substrate having formed therein a series of photo active regions. There is also formed over the substrate at least one color filter layer having formed therein a color filter region having a concave upper surface. There is also formed upon the at least one color filter layer and planarizing the at least one color filter region having the concave upper surface, a planarizing layer. The planarizing layer provides for enhanced resolution of the color filter image array optoelectronic microelectronic fabrication.

14 Claims, 1 Drawing Sheet

COLOR FILTER IMAGE ARRAY OPTOELECTRONIC MICROELECTRONIC FABRICATION WITH A PLANARIZING LAYER FORMED UPON A CONCAVE SURFACED COLOR FILTER REGION

BACKGROUND OF THE INVENTION

1. Field of the Invention

The present invention relates generally to methods for fabricating image array optoelectronic microelectronic fabrications. More particularly, the present invention relates to methods for fabricating, with enhanced resolution, image array optoelectronic microelectronic fabrications.

2. Description of the Related Art

Microelectronic fabrications are formed from microelectronic substrates over which are formed patterned microelectronic conductor layers which are separated by microelectronic dielectric layers. Within the general category of microelectronic fabrication, there exist in a first instance microelectronic fabrications whose operation is based solely upon electrical signal storage and processing characteristics of microelectronic devices and microelectronic circuits formed upon a microelectronic substrate. Examples of such microelectronic fabrications typically include semiconductor integrated circuit microelectronic fabrications and ceramic substrate packaging microelectronic fabrications. Similarly, in a second instance, there also exist within the general category of microelectronic fabrication microelectronic fabrications whose operation is predicated upon a codependent transduction, storage and/or processing of optical and electrical signals while employing optoelectronic microelectronic devices formed upon a microelectronic substrate. Examples of such optoelectronic microelectronic fabrications typically include, but are not limited to: (1) solar cell optoelectronic microelectronic fabrications, as well as; (2) image array optoelectronic microelectronic fabrications, such as but not limited to: (a) sensor image array optoelectronic microelectronic fabrications (i.e. color filter sensor image arrays), as well as: (b) display image array optoelectronic microelectronic fabrications (i.e. flat panel display image arrays). Sensor image array optoelectronic microelectronic fabrications find common usage in advanced consumer products such as digital cameras, while display image array optoelectronic microelectronic fabrications are well recognized and commonly employed as visual interface elements within mobile computers.

While the level of complexity and integration of both purely electronic microelectronic fabrications and optoelectronic microelectronic fabrications continues to increase, fabrication of advanced optoelectronic microelectronic fabrications often provides unique fabrication challenges insofar as fabrication of advanced optoelectronic microelectronic fabrications requires attention to both the optical properties and the electrical properties of materials which are employed in forming such advanced optoelectronic microelectronic fabrications. For example, of the problems which are commonly encountered when fabricating advanced image array optoelectronic microelectronic fabrications, problems in achieving enhanced resolution, and in particular enhanced color filter resolution within a color filter image array optoelectronic microelectronic fabrication, is often encountered.

It is thus towards the goal of forming advanced image array optoelectronic microelectronic fabrications with enhanced resolution, and in particular advanced color filter image array optoelectronic microelectronic fabrications with enhanced color filter resolution, that the present invention is directed.

Various optoelectronic microelectronic fabrication methods, and/or resulting optoelectronic microelectronic fabrications, have been disclosed in the art of optoelectronic microelectronic fabrication for forming optoelectronic microelectronic fabrications with desirable properties within the art of optoelectronic microelectronic fabrication.

Included among the optoelectronic microelectronic fabrication methods and/or resulting optoelectronic microelectronic fabrications, but not limiting among the optoelectronic microelectronic fabrication methods and/or resulting optoelectronic microelectronic fabrications, are optoelectronic microelectronic fabrication methods and/or resulting optoelectronic microelectronic fabrications disclosed within: (1) Sano et al., in U.S. Pat. No. 5,514,888 (a sensor image array optoelectronic microelectronic fabrication, and a method for fabrication thereof, comprising a multiplicity of light shielding layers vertically stacked and at least in part separated by a planarizing layer, such as to attenuate spurious light capture by a photodiode within the sensor image array optoelectronic microelectronic fabrication); and (2) Fan et al., in U.S. Pat. No. 6,171,885 (a color filter sensor image array optoelectronic microelectronic fabrication, and a method for fabrication thereof, wherein a microlens layer is fabricated prior to a color filter layer within the color filter sensor image array optoelectronic microelectronic fabrication, such as to provide for fabrication efficiency when fabricating the color filter sensor image array optoelectronic microelectronic fabrication).

Desirable in the art of optoelectronic microelectronic fabrication are additional methods and materials which may be employed for forming image array optoelectronic microelectronic fabrications with enhanced resolution, and in particular for forming color filter image array optoelectronic microelectronic fabrications with enhanced color filter resolution.

It is towards the foregoing objects that the present invention is directed.

SUMMARY OF THE INVENTION

A first object of the present invention is to provide a method for forming an image array optoelectronic microelectronic fabrication.

A second object of the present invention is to provide a method for forming an image array optoelectronic microelectronic fabrication in accord with the first object of the present invention, where the image array optoelectronic microelectronic fabrication is formed with enhanced resolution.

A third object of the present invention is to provide a method for forming an image array optoelectronic microelectronic fabrication in accord with the first object of the present invention and the second object of the present invention, where the method is readily commercially implemented.

In accord with the objects of the present invention, there is provided by the present invention a method for forming a color filter image array optoelectronic microelectronic fabrication, as well as a color filter image array optoelectronic microelectronic fabrication which may be formed employing the method.

To practice the method of the present invention, there is first provided a substrate having formed therein an array of photo active regions. There is then formed over the array of photo active regions at least one color filter layer which provides an array of color filter regions which register with the array of photo active regions. Within the present invention, at least one color filter region within the array of color filter regions is formed with a concave upper surface. Finally, there is then formed upon the at least one layer color filter layer, and planarizing the at least one color filter region which is formed with the concave upper surface, a planarizing layer.

The method for forming the image array optoelectronic microelectronic fabrication in accord with the present invention contemplates an image array optoelectronic microelectronic fabrication which may be formed in accord with the method for forming the image array optoelectronic microelectronic fabrication in accord with the present invention.

There is provided by the present invention a method for forming an image array optoelectronic microelectronic fabrication, and an image array optoelectronic microelectronic fabrication which may be formed employing the method, where the image array optoelectronic microelectronic fabrication is formed with enhanced resolution.

The present invention realizes the foregoing object by employing when forming a color filter image array optoelectronic microelectronic fabrication comprising: (1) a substrate having formed therein an array of photo active regions, in turn having formed thereover; (2) at least one color filter layer which provides an array of color filter regions which register with the array of photo active regions, where at least one color filter region within the array of color filter regions is formed with a concave upper surface; (3) a planarizing layer formed upon the at least one layer color filter layer and planarizing the at least one color filter region which is formed with the concave upper surface. By employing such a planarizing layer within a color filter image array optoelectronic microelectronic fabrication, the color filter image array optoelectronic microelectronic fabrication is formed with enhanced resolution since optical dispersion resulting from the concave upper surface of the at least one color filter region is compensated by the planarizing layer.

The present invention is readily commercially implemented.

As will be illustrated in greater detail in conjunction with the Description of the Preferred Embodiment, as set forth below, the present invention employs methods and materials as are generally known in the art of optoelectronic microelectronic fabrication, and more specifically known in the art of image array optoelectronic microelectronic fabrication, and yet more specifically known in the art of color filter image array optoelectronic microelectronic fabrication, but wherein such methods and materials are employed within the context of fabrication process controls and design considerations which provide at least in part the present invention. Since it is thus a process control, in conjunction with a design consideration, which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
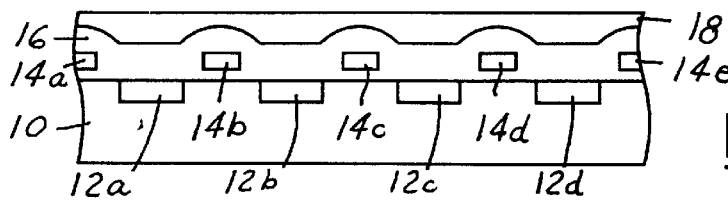
FIG. 1, FIG. 2, FIG. 3, FIG. 4, FIG. 5, FIG. 6 and FIG. 7 show a series of schematic cross-sectional diagrams illustrating the results of progressive stages in forming a color filter sensor image array optoelectronic microelectronic fabrication in accord with a preferred embodiment of the present invention.

There is provided by the present invention a method for forming an image array optoelectronic microelectronic fabrication, and the image array optoelectronic microelectronic fabrication which may be formed in accord with the method, where the image array optoelectronic microelectronic fabrication is formed with enhanced resolution.

The present invention realizes the foregoing object by employing when forming a color filter image array optoelectronic microelectronic fabrication comprising: (1) a substrate having formed therein an array of photo active regions, in turn having formed thereover; (2) at least one color filter layer which provides an array of color filter regions which register with the array of photo active regions, wherein at least one color filter region within the array of color filter regions is formed with a concave upper surface; (3) a planarizing layer formed upon the at least one color filter layer and planarizing the at least one color filter region which is formed with the concave upper surface. By employing such a planarizing layer within a color filter image array optoelectronic microelectronic fabrication, the color filter image array optoelectronic microelectronic fabrication is formed with enhanced resolution since optical dispersion resulting from the concave upper surface of the at least one color filter region is compensated by the planarizing layer.

Although the preferred embodiment of the present invention illustrates the present invention within the context of a color filter sensor image array optoelectronic microelectronic fabrication having formed therein a nominally single layer color filter layer having formed therein at least one color filter region formed with a concave upper surface, the method of the present invention may be employed for forming, with enhanced resolution, color filter sensor image array optoelectronic microelectronic fabrications (which typically employ photo diode photo sensitive photo active regions) and color filter display image array optoelectronic microelectronic fabrications (which may employ light emitting diode photo emitting photo active regions). Similarly, the present invention may also employ a multi-layer color filter layer construction to provide an array of color filter regions, provided that at least one color filter region within the array of color filter regions is formed with a concave upper surface. Within the present invention, a series of color filter regions within a single layer color filter layer or within multiple layer color filter layers within a color filter image array optoelectronic microelectronic fabrication may be formed employing a sub-series of patterned color filter layers of colors including but not limited to red, green, blue, yellow, cyan and magenta.

Within the present invention and the preferred embodiment of the present invention, including the claims, it is assumed for reference purposes that a substrate is provided in a nominally horizontal position and various layers and structures are formed therein and thereover, to provide a color filter image array optoelectronic microelectronic fabrication in accord with the present invention. However, when completed, a color filter sensor image array optoelectronic microelectronic fabrication in accord with the present invention is not typically employed in a horizontal position.

Referring now to FIG. 1 to FIG. 7, there is shown a series of schematic cross-sectional diagrams illustrating the results of progressive stages of forming, in accord with a preferred embodiment of the present invention, a color filter sensor image array optoelectronic microelectronic fabrication, with enhanced resolution.

Shown in FIG. 1 is a schematic cross-sectional diagram of the color filter sensor image array optoelectronic microelectronic fabrication at an early stage in its fabrication in accord with the preferred embodiment of the present invention.

Shown within FIG. 1, in a first instance, is a substrate 10 having formed therein a series of photo active regions 12a, 12b, 12c and 12d. Within the preferred embodiment of the present invention with respect to the substrate 10, the substrate 10 is typically and preferably a monocrystalline silicon semiconductor substrate. Typically and preferably, the monocrystalline silicon semiconductor substrate will have an N− or P− doping. Similarly, within the preferred embodiment of the present invention with respect to the series of photo active regions 12a, 12b, 12c and 12d, the series of photo active regions 12a, 12b, 12c and 12d will typically comprise photo diode photo sensitive photo active regions, as employed within devices including but not limited to charge coupled device (CCD) devices, charge injection device (CID) devices and optically active complementary metal oxide semiconductor (CMOS) devices. In general, the series of photo active regions 12a, 12b, 12c and 12d when formed as a series of photo diodes will typically and preferably comprise at least in part a complementary P+ or N+ doping with respect to the substrate 10.

Although FIG. 1 illustrates the substrate 10 as a flat substrate having the series of photo active regions 12a, 12b, 12c and 12d formed contiguously therein, as is understood by a person skilled in the art, the series of photo active regions 12a, 12b, 12c and 12d may also be formed topographically within the substrate 10, and the substrate 10 may also have formed therein additional appropriate layers and structures, such as but not limited to channel stop layers and channel stop structures, as are needed to adequately isolate the series of photo active regions 12a, 12b, 12c and 12d within the substrate 10.

Shown also within FIG. 1 formed upon and covering the substrate 10 including the series of photo active regions 12a, 12b, 12c and 12d is a blanket passivation layer 16 which has formed therein at locations alternating with the series of photo active regions 12a, 12b, 12c and 12d a series of patterned conductor layers 14a, 14b, 14c, 14d and 14e. The series of patterned conductor layers 14a, 14b, 14c, 14d and 14e typically serves as a first directional charge collection array within the color filter sensor image array optoelectronic microelectronic fabrication whose schematic cross-sectional diagram is illustrated in FIG. 1, while the blanket passivation layer 16 serves to separate the patterned conductor layers 14a, 14b, 14c, 14d and 14e from the substrate 10 and the series of photo active regions 12a, 12b, 12c and 12d.

Within the preferred embodiment of the present invention with respect to the blanket passivation layer 16, the blanket passivation layer 16 is typically and preferably formed of a passivation material which is transparent to incident electromagnetic radiation for whose detection and classification the color filter diode sensor image array optoelectronic microelectronic fabrication whose schematic cross-sectional diagram is illustrated in FIG. 1 is designed. Typically and preferably, the blanket passivation layer 16 is formed of a passivation material selected from the group including but not limited to silicon oxide passivation materials, silicon nitride passivation materials, silicon oxynitride passivation materials and composites thereof, and formed to a thickness of from about 500 to about 35000 angstroms.

Similarly, within the preferred embodiment of the present invention with respect to the series of patterned conductor layers 14a, 14b, 14c, 14d and 14e, each of the series of patterned conductor layers 14a, 14b, 14c, 14d and 14e is formed of a conductor material as is similarly also conventional in the art of optoelectronic microelectronic fabrication, such conductor materials being selected from the group including but not limited to metal, metal alloy, doped polysilicon (having a dopant concentration greater than about 1E15 atoms per cubic centimeter) and polycide (doped polysilicon/metal silicide stack) conductor materials.

Shown also within FIG. 1 formed upon the blanket passivation layer 16 is a blanket first planarizing layer 18. Within the preferred embodiment of the present invention with respect to the blanket first planarizing layer 18, the blanket first planarizing layer 18 may be formed employing methods and materials as are conventional in the art of optoelectronic microelectronic fabrication. Typically and preferably, the blanket first planarizing layer 18 is formed of a planarizing material which, similarly with the blanket passivation layer 16, is transparent to a spectrum of electromagnetic radiation whose detection and classification is effected while employing the color filter sensor image array optoelectronic microelectronic fabrication whose schematic cross-sectional diagram is illustrated in FIG. 1. Such planarizing materials may include, but are not limited to, spin-on-glass (SOG) planarizing materials and spin-on-polymer (SOP) planarizing materials. For the preferred embodiment of the present invention, the blanket planarizing layer 18 is preferably formed of a spin-on-polymer (SOP) planarizing material, such as but not limited to a photoresist spin-on-polymer (SOP) planarizing material, preferably formed to a thickness of from about 10000 to about 30000 angstroms upon the blanket passivation layer 16.

Figure 2:
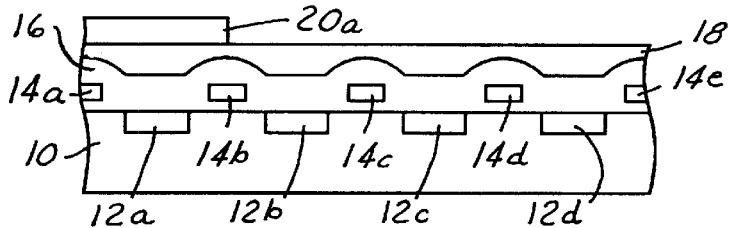
Figure 3:
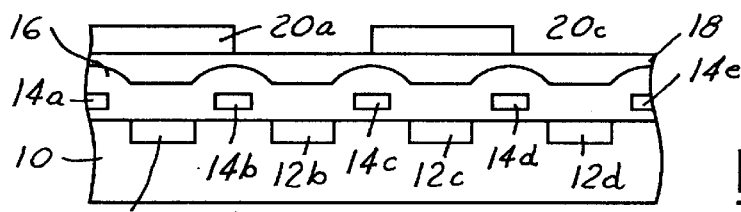

Referring now to FIG. 2, there is shown a schematic cross-sectional diagram illustrating the results of further processing of the color filter sensor image array optoelectronic microelectronic fabrication whose schematic cross-sectional diagram is illustrated in FIG. 3.

Shown in FIG. 2 is a schematic cross-sectional diagram of a color filter sensor image array optoelectronic microelectronic fabrication otherwise equivalent to the color filter sensor image array optoelectronic microelectronic fabrication whose schematic cross-sectional diagram is illustrated in FIG. 1, but wherein there is formed upon the blanket planarizing layer 18, and registered with the photo active region 12a, a patterned first color filter layer 20a.

Within the preferred embodiment of the present invention, the patterned first color filter layer 20a may be formed employing methods and materials as are conventional in the art of color filter image array optoelectronic microelectronic fabrication. Such methods will typically and preferably include photolithographic methods through which the patterned first color filter layer 20a is formed, and either intrinsically or extrinsically dyed or pigmented with a color selected from the group consisting of red, blue and green, or an alternative color selected from the group consisting of yellow, cyan and magenta. Typically and preferably, the patterned first color filter layer 20a is formed to a thickness of from about 10000 to about 20000 angstroms and a linewidth from about 2 to about 15 microns. Although not specifically illustrated within the schematic cross-sectional diagram of FIG. 2, and in accord with Fan et al., as cited within the Description of the Related Art, all of which related art is incorporated herein fully by reference, the patterned first color filter layer 20a (and subsequent patterned color filter layers) may be employed areally within a striped pattern, a mosaic pattern or an alternate pattern, when forming a color filter sensor image array optoelectronic microelectronic fabrication.

Referring now to FIG. 3, there is shown a schematic cross-sectional diagram illustrating the results of further processing of the color filter sensor image array optoelectronic microelectronic fabrication whose schematic cross-sectional diagram is illustrated in FIG. 2.

Shown in FIG. 3 is a schematic cross-sectional diagram of a color filter sensor image array optoelectronic microelectronic fabrication otherwise equivalent to the color filter sensor image array optoelectronic microelectronic fabrication whose schematic cross-sectional diagram is illustrated in FIG. 2, but wherein there is also formed upon the blanket first planarizing layer 18 and registered with the photo active region 12c a patterned third color filter layer 20c.

Within the present invention and the preferred embodiment of the present invention with respect to the patterned third color filter layer 20c, the patterned third color filter layer 20c may be formed employing methods, materials and dimensions analogous or equivalent to the methods, materials and dimensions employed for forming the patterned first color filter layer 20a, but generally dyed or pigmented with a second color from the group consisting of red, blue and green, or with an alternative second color from the group consisting of yellow, cyan and magenta.

Figure 4:
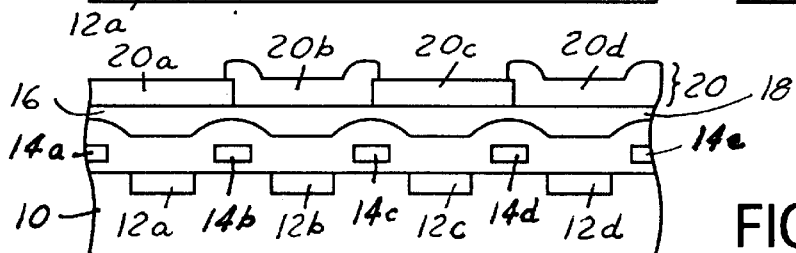

Referring now to FIG. 4, there is shown a schematic cross-sectional diagram illustrating the results of further processing of the color filter sensor image array optoelectronic microelectronic fabrication whose schematic cross-sectional diagram is illustrated in FIG. 3.

Shown in FIG. 4 is a schematic cross-sectional diagram of a color filter sensor image array optoelectronic microelectronic fabrication otherwise equivalent to the color filter sensor image array optoelectronic microelectronic fabrication whose schematic cross-sectional diagram is illustrated in FIG. 3, but wherein there is finally also formed upon remaining portions of the blanket first planarizing layer 18, and registered with the photo active region 12b and the photo active region 12d, a corresponding patterned second color filter layer 20b and a corresponding patterned fourth color filter layer 20d.

Within the preferred embodiment of the present invention, the patterned second color filter layer 20b and the patterned fourth color filter layer 20d may be formed employing methods, materials and dimensions analogous or equivalent to the methods, materials and dimensions employed for forming the patterned first color filter layer 20a and the patterned third color filter layer 20c, but employing the remaining third color within the group consisting of red, blue and green, or the remaining alternative third color within the group consisting of yellow, cyan and magenta.

As is illustrated within the schematic cross-sectional diagram of FIG. 4, it is common in the art of image array optoelectronic microelectronic fabrication for the patterned second color filter layer 20b and the patterned fourth color filter layer 20d to overlap in pertinent parts with the patterned first color filter layer 20a and the patterned third color filter layer 20c. Such overlap may result from a photolithographic mis-registration when forming any of the series of patterned color filter layers 20a, 20b, 20c and 20d, or it may be intentional, such as to assure that the series of patterned color filter layers 20a, 20b, 20c and 20d form a horizontally contiguous layer without any gaps. As is illustrated within the schematic cross-sectional diagram of FIG. 4, the series of patterned color filter layers 20a, 20b, 20c and 20d form a nominal single layer color filter layer 20, where the series of patterned color filter layers 20a, 20b, 20c and 20d form a series of horizontally adjoining color filter regions within the nominal single layer color filter layer 20. Similarly, and under circumstances where each of the series of patterned color filter layers 20a, 20b, 20c and 20d is formed of an intrinsically dyed or pigmented patterned negative photoresist material, there is generally limited concern with inter-diffusion of the series of patterned color filter layers 20a, 20b, 20c and 20d. However, when employing other materials combinations for forming the series of patterned color filter layers 20a, 20b, 20c and 20d, there may also be employed within the context of the present invention an impervious liner layer separating the patterned second color filter layer 20b and the patterned fourth color filter layer 20d from horizontally adjacent patterned color filter layers within a color filter sensor image array optoelectronic microelectronic fabrication analogous to the color filter sensor image array optoelectronic microelectronic fabrication whose schematic cross-sectional diagram is illustrated in FIG. 4.

Finally, as is also illustrated within the schematic cross-sectional diagram of FIG. 4, and due to the nature of the photolithographic method by which they are formed, each of the patterned second color filter layer 20b and the patterned fourth color filter layer 20d is formed with a concave upper surface. As is further illustrated within the schematic cross-sectional diagram of FIG. 4, the concave upper surface within each of the patterned second color filter layer 20b and the patterned fourth color filter layer 20d defines a corresponding concavity registered with the corresponding photo active region 12b or 12d. Each of the pair of concavities has a depth of at least about 5000 angstroms As is understood by a person skilled in the art, such a concave upper surface is undesirable in the art of image array optoelectronic microelectronic fabrication insofar as such a concave upper surface provides for dispersion of incident electromagnetic radiation (i.e., light) whose detection and classification is effected by the color filter sensor image array optoelectronic microelectronic fabrication whose schematic cross-sectional diagram is illustrated in FIG. 4. Such dispersion in turn provides for incident electromagnetic radiation intensity loss, cross-talk and compromised resolution of the color filter sensor image array optoelectronic microelectronic fabrication whose schematic cross-sectional diagram is illustrated in FIG. 4.

Figure 5:
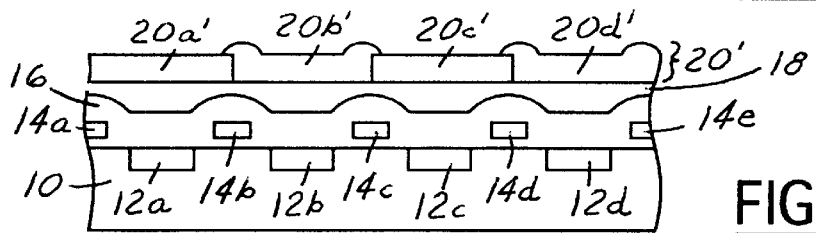

Referring now to FIG. 5, there is shown a schematic cross-sectional diagram illustrating the results of further processing of the color filter sensor image array optoelectronic microelectronic fabrication whose schematic cross-sectional diagram is illustrated in FIG. 4.

Shown in FIG. 5 is a schematic cross-sectional diagram of a color filter sensor image array optoelectronic microelectronic fabrication otherwise equivalent to the color filter sensor image array optoelectronic microelectronic fabrication whose schematic cross-sectional diagram is illustrated in FIG. 4, but wherein the blanket color filter layer 20 has been thermally annealed to form a thermally annealed blanket color filter layer 20' which comprises a series of thermally annealed patterned color filter layers 20a', 20b', 20c' and 20d', which in turn still provide a series of color filter regions.

Typically and preferably, the thermal annealing is undertaken at a temperature of from about 150 to about 250 degrees centigrade for a time period of from about 10 to about 30 minutes, to provide the series of thermally annealed patterned color filter layers 20a', 20b', 20c' and 20d', where the thermally annealed patterned second color filter layer 20b' and the thermally annealed patterned fourth color filter layer 20d' still exhibit concave upper surfaces, but somewhat diminished. Typically and preferably, a concavity within each of the patterned second color filter layer 20b, the patterned fourth color filter layer 20d, the thermally annealed patterned second color filter layer 20b' and the thermally annealed patterned fourth color filter layer 20d' is formed to a depth of from about 1 μm to about 2 μm within the patterned color filter layer.

Figure 6:
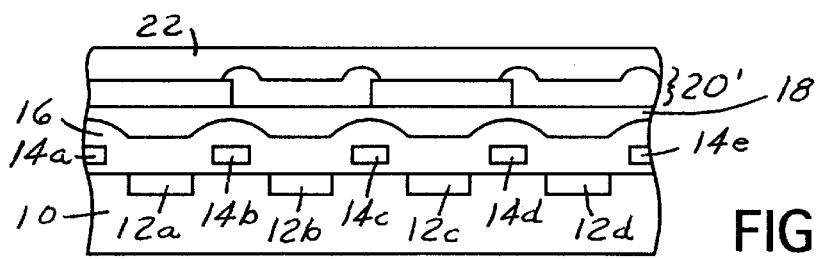

Referring now to FIG. 6, there is shown a schematic cross-sectional diagram illustrating the results of further processing of the color filter sensor image array optoelectronic microelectronic fabrication whose schematic cross-sectional diagram is illustrated in FIG. 5.

Shown in FIG. 6 is a schematic cross-sectional diagram of a color filter sensor image array optoelectronic microelectronic fabrication otherwise equivalent to the color filter sensor image array optoelectronic microelectronic fabrication whose schematic cross-sectional diagram is illustrated in FIG. 5, but wherein there is formed upon the thermally annealed blanket color filter layer 20' a blanket second planarizing layer 22 which provides a planar surface to the color filter sensor image array optoelectronic microelectronic fabrication and in particular to the thermally annealed patterned second color filter layer 20b' and the thermally annealed patterned fourth color filter layer 20d'.

Within the preferred embodiment of the present invention, the blanket second planarizing layer 22 is typically and preferably formed of a planarizing material having an index of refraction closely matched to the index of refraction of the material from which is formed the series of thermally annealed patterned color filter layers 20a', 20b', 20c' and 20d'. Thus, under circumstances where the series of thermally annealed patterned color filter layers 20a', 20b', 20c' and 20d' is formed of an intrinsically or extrinsically dyed or pigmented photoresist material, the blanket second planarizing layer 22 may be formed of the same photoresist material, but absent the intrinsic or extrinsic dye or pigment.

Typically and preferably, the blanket second planarizing layer 22 is formed to a thickness of from about 10000 to about 30000 angstroms, and by its presence it attenuates dispersion of incoming light whose detection and quantification is effected by the color filter image array optoelectronic microelectronic fabrication whose schematic cross-sectional diagram is illustrated in FIG. 6. Thus, there is provided enhanced resolution of the color filter sensor image array optoelectronic microelectronic fabrication whose schematic cross-sectional diagram is illustrated in FIG. 6.

Figure 7:
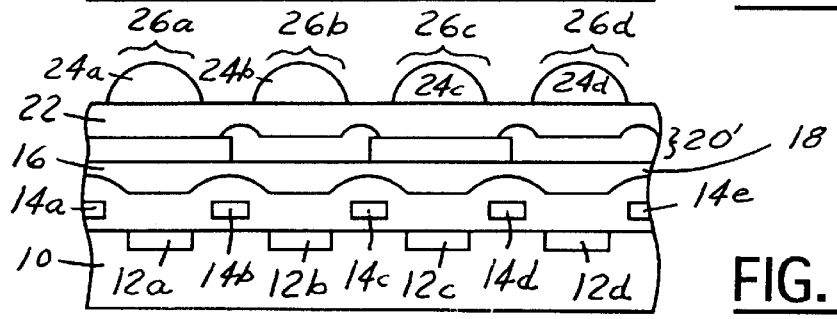

Referring now to FIG. 7, there is shown a schematic cross-sectional diagram illustrating the results of further processing of the color filter image array optoelectronic microelectronic fabrication whose schematic cross-sectional diagram is illustrated in FIG. 6.

Shown in FIG. 7 is a schematic cross-sectional diagram of a color filter sensor image array optoelectronic microelectronic fabrication whose schematic cross-sectional diagram is illustrated in FIG. 6, but wherein there is formed upon the blanket second planarizing layer 22 and registered with each of the corresponding photo active regions 12a, 12b, 12c and 12b, a series of optional corresponding patterned microlens layer 24a, 24b, 24c or 24d which are not necessarily required within the present invention.

Within the preferred embodiment of the present invention with respect to the optional series of patterned microlens layers 24a, 24b, 24c and 24d, the optional series of patterned microlens layers 24a, 24b, 24c and 24d is, as is conventional in the art of optoelectronic microelectronic fabrication, formed of a patterned photoresist material of appropriate optical properties, where the patterned photoresist material is thermally reflowed to form the series of patterned microlens layers 24a, 24b, 24c and 24d of convex shape, as illustrated within the schematic cross-sectional diagram of the color filter sensor image array optoelectronic microelectronic fabrication as illustrated in FIG. 7.

As is illustrated within the schematic cross-sectional diagram of FIG. 7, each portion of the color filter sensor image array optoelectronic microelectronic fabrication which includes a patterned microlens layer 24a, 24b, 24c or 24d, in conjunction with a corresponding photo active region 12a, 12b, 12c or 12d of the substrate 10, comprises an active pixel element 26a, 26b, 26c or 26d of the color filter sensor image array optoelectronic microelectronic fabrication.

Upon forming upon the color filter sensor image array optoelectronic microelectronic fabrication whose schematic plan-view diagram is illustrated in FIG. 7 there is formed a color filter sensor image array optoelectronic microelectronic fabrication in accord with a preferred embodiment of the present invention. The color filter sensor image array optoelectronic microelectronic fabrication so formed is formed with enhanced resolution insofar a color filter layer formed therein, in turn having a color filter region formed therein with a concave surface, in turn has formed thereupon a planarizing layer.

As is finally understood by a person skilled in the art, the preferred embodiment of the present invention is illustrative of the present invention rather than limiting of the present invention. Revisions and modifications may be made to methods, materials, structures and dimensions which may be employed to form a color filter sensor image array optoelectronic microelectronic fabrication in accord with the preferred embodiment of the present invention, while still forming a color filter image array optoelectronic microelectronic fabrication in accord within the present invention, further in accord with the appended claims.

What is claimed is:

1. A method for forming a color filter image array optoelectronic microelectronic fabrication comprising:
   providing a substrate having formed therein an array of photo active regions;
   forming over the array of photo active regions at least one color filter layer which provides an array of color filter regions which register with the array of photo active regions, wherein at least one color filter region within the array of color filter regions is formed with a concave upper surface which defines a concavity which is registered with a photo active region; and
   forming upon the at least one color filter layer and planarizing the at least one color filter region which is formed with the concave upper surface a planarizing layer.

2. The method of claim 1 wherein the array of photo active regions is an array of photo diodes.

3. The method of claim 1 wherein the array of photo active regions is an array of light emitting diodes.

4. The method of claim 1 wherein the at least one color filter layer is a single layer color filter layer having formed horizontally adjacent therein the array of color filter regions.

5. The method of claim 1 wherein each color filter region within the array of color filter regions has a linewidth of from about 2 to about 15 microns.

6. The method of claim 1 wherein the concavity has a depth of at least about 5000 angstroms.

7. The method of claim 1 wherein an index of refraction of the planarizing layer is matched to an index of refraction of the at least one color filter region having the concave upper surface.

8. A color filter image array optoelectronic microelectronic fabrication comprising:

a substrate having formed therein an array of photo active regions;

at least one color filter layer formed over the substrate and the array of photo active regions, where the at least one color filter layer provides an array of color filter regions which register with the array of photo active regions, further where at least one color filter region within the array of color filter regions is formed with a concave upper surface which defines a concavity registered with a photo active region; and a planarizing layer formed upon the at least one layer color filter layer and planarizing the at least one color filter region which is formed with the concave upper surface.

9. The color filter image array optoelectronic microelectronic fabrication of claim 8 wherein the array of photo active regions is an array of photo diodes.

10. The color filter image array optoelectronic microelectronic fabrication of claim 8 wherein the array of photo active regions is an array of light emitting diodes.

11. The color filter image array optoelectronic microelectronic fabrication of claim 8 wherein the at least one color filter layer is a single layer color filter layer having formed horizontally adjacent therein the array of color filter regions.

12. The color filter image array optoelectronic microelectronic fabrication of claim 8 wherein each color filter region within the array of color filter regions has a linewidth of from about 2 to about 15 microns.

13. The color filter image array optoelectronic microelectronic fabrication of claim 8 wherein the concavity has a depth of at least about 5000 angstroms.

14. The color filter image array optoelectronic microelectronic fabrication of claim 8 wherein an index of refraction of the planarizing layer is matched to an index of refraction of at least one color filter region having the concave upper surface.

* * * * *